United States Patent [19]

Lilly

[11] Patent Number: 5,534,780
[45] Date of Patent: Jul. 9, 1996

[54] SAMPLE CHANGER FOR NMR SPECTROMETERS

[75] Inventor: Kevin Lilly, Derry, N.H.

[73] Assignee: Bruker Instruments, Inc., Billerica, Mass.

[21] Appl. No.: 224,269

[22] Filed: Apr. 7, 1994

[51] Int. Cl.$^6$ .................................................. G01R 33/20
[52] U.S. Cl. ............................................ 324/321; 422/63
[58] Field of Search ................................... 324/300, 321, 324/318, 317; 209/552, 922, 906; 414/744.1, 222; 73/861.81, 864.91; 422/62–64

[56] References Cited

U.S. PATENT DOCUMENTS

| | | | |
|---|---|---|---|
| 4,581,583 | 4/1986 | Van Vliet et al. | 324/321 |
| 4,723,474 | 2/1988 | Flohr | 91/36 |
| 4,859,948 | 8/1989 | Kuster | 324/318 |
| 5,146,166 | 9/1992 | Bartuska | 324/321 |
| 5,314,662 | 5/1994 | Hemzy et al. | 422/63 |

FOREIGN PATENT DOCUMENTS 4-264706  10/1993  Japan .

Primary Examiner—Sandra L. O'Shea
Assistant Examiner—Raymond Y. Mah
Attorney, Agent, or Firm—Bookstein & Kudirka

[57] ABSTRACT

A sample changer for a spectrometer of the type having a generally vertical sample loading air shaft in which an upflowing air stream is present. The sample changer includes a support for positioning at the spectrometer and a carriage movably supported by the support which carriage has an array of generally vertical passages extending entirely through the carriage, those passages being adapted to contain sample holders. The sample changer also includes an actuator for moving the carriage relative to the support to position each passage over the air shaft so that that passage becomes an extension of the air shaft whereby the sample holder in that shaft may be buoyed up and supported in its passage by the air stream from the airshaft. Provision is also made for releasing the sample holder from the carriage passage that is located directly over the air shaft so that that sample holder may be moved from its passage down into the air shaft and raised up and returned to its passage solely under the control of the air stream in the air shaft thereby enabling the sample changer to be slaved to the spectrometer.

14 Claims, 4 Drawing Sheets

SAMPLE CHANGER FOR NMR SPECTROMETERS

FIELD OF THE INVENTION

This invention relates to a sample changer for nuclear magnetic resonance (NMR) spectrometers. It relates more particularly to sample changing apparatus for attachment to a spectrometer in order to feed a succession of samples automatically to the spectrometer for analysis and retrieve the samples from that instrument following same.

BACKGROUND OF THE INVENTION

An NMR spectrometer is an instrument which can analyze a sample by subjecting the sample to a very strong magnetic field. In a typical spectrometer, a sample is placed in a sample holder consisting of a very small diameter tubular container, which is supported by a generally cylindrical, lightweight, stopper-like support. The support is sized to slidably fit in a vertical shaft which extends down between the poles of the spectrometer magnet. An upwardly flowing air stream is provided in the shaft which is sufficiently strong to transport the sample holder between the top of the shaft and a sample locator positioned between the magnet poles and usually consisting of a constriction in the magnet shaft. In other words, the sample holder may be moved up and down within the shaft by the column of air in that shaft.

The sample holder is loaded into the spectrometer by placing the holder at the entrance to the magnet shaft where it is supported by the column of air in the shaft. Then, the air flow in the shaft is reduced to lower the sample holder down into the shaft to the sample locator where the sample in the holder is to be analyzed. Following the analysis, the air flow in the tube is increased to return the sample holder to the top of the magnet shaft where the holder will "float" on the escaping air until grasped and removed from the spectrometer.

Usually the sample holders are inserted into and removed from the spectrometer manually which requires the constant attendance of an operator. Successive holders may also be loaded and unloaded automatically using a robotic arm which emulates the manual loading and unloading operations. However, such mechanical arms are relatively complex and expensive. Furthermore, they occupy a relatively large amount of space. Also, existing robotic sample changers require extensive mounting and alignment procedures, as well as electronic interfacing with the spectrometer in order to operate properly.

SUMMARY OF THE INVENTION

Accordingly, it is an object of the present invention to provide improved apparatus for automatically changing samples in a NMR spectrometer and in other instruments which support and/or transport samples by a moving column of air.

Another object of the invention is to provide a sample changer which requires no interfacing with the associated spectrometer beyond the mechanical replacement of the sample holder at the entrance to the air shaft of the spectrometer.

Yet another object of the invention is to provide such a sample changer which is relatively easy and inexpensive to manufacture.

A further object of the invention is to provide a sample changer of this type which occupies a relatively small amount of space.

Other objects of the invention will, in part, be obvious and will, in part, appear hereinafter.

The invention accordingly comprises the features of construction, combination of elements and arrangements of parts which will be exemplified in the construction set forth hereinafter, and the scope of the invention will be indicated in the claims.

Briefly, the sample changer comprises a housing which may be positioned on a spectrometer opposite the entrance to the vertical air shaft in the spectrometer into which a sample holder is placed so that the sample in the holder can be analyzed by the spectrometer.

A carriage containing an array of vertical passages is movably positioned in the changer housing so that the passages can be moved one after the other opposite the entrance to the spectrometer shaft, the operative passage becoming, in effect, an extension of the shaft and receiving the upwardly flowing air stream therein.

The carriage passages are arranged to receive sample holders and means are provided for releasably retaining the holders in their respective carriage passages except when a passage is positioned opposite the shaft entrance. Thus, by moving the carriage to position a particular passage over the shaft, the sample holder in that passage can be lowered from its passage down into the shaft to the sample locator therein solely under the control of the air stream in order to analyze the sample in that holder.

Following the analysis, the sample holder may be raised up from the sample locator and returned to its original position in the carriage solely by the air stream from the air shaft and be retained in that passage when that passage moves away from the shaft entrance as the sample in the next passage is being indexed into position opposite the shaft entrance.

The sample changer also includes motive means for moving the carriage and control means for controlling that movement so that a succession of samples will be deposited in and retrieved from the spectrometer shaft automatically. Furthermore, this is accomplished without requiring precise mounting of the changer to the spectrometer or any electronic interfacing between the two. The changer is only required to mechanically place the sample holder at the entrance to the air shaft of the spectrometer to be able to meet the requirements of that instrument.

BRIEF DESCRIPTION OF THE DRAWINGS

The above and further advantages of the invention may be understood better by referring to the following description in conjunction with the accompanying drawings, in which.

DETAILED DESCRIPTION OF ILLUSTRATIVE EMBODIMENT

Figure 1:
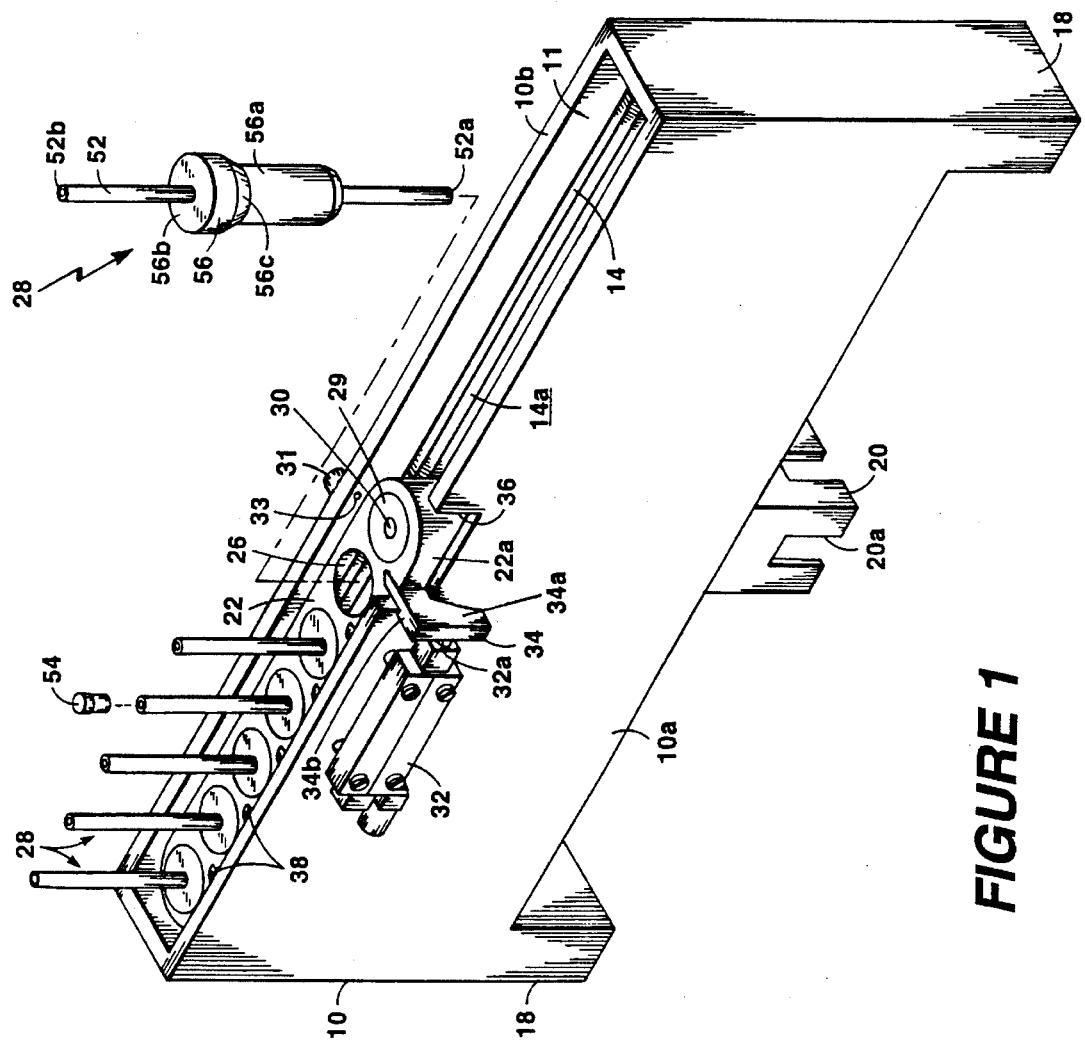
FIG. 1 is an exploded isometric view of a sample changer incorporating the invention.
Figure 2:
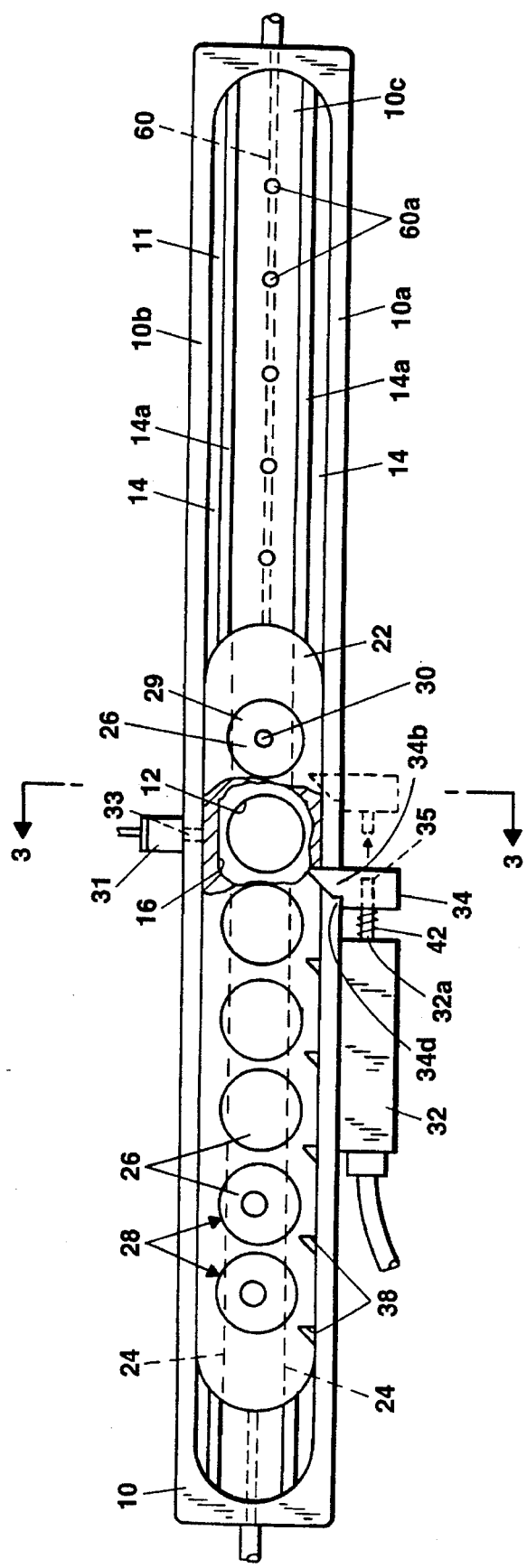
FIG. 2 is a plan view of the FIG. 1 sample changer positioned to load the first sample.

Referring to FIGS. 1 and 2 of the drawings, my sample changer comprises an elongated generally rectangular housing 10 having front wall 10a, a rear wall 10b and a bottom wall 10c defining a space 11 inside the housing. Formed in the middle of the bottom wall 10a is a relatively large opening 12. Projecting inward from housing walls 10a and 10b at locations spaced above the housing bottom wall 10c is a pair of mirror image rails 14, 14 which extend the entire length of housing 10. Preferably, the upper corners of the rails are beveled to form inclined surfaces 14a, 14a. Also, cut-outs or reliefs 16, 16 are provided in rails 14, 14 that register with the opening 12 in the housing bottom wall 10c.

Figure 3:
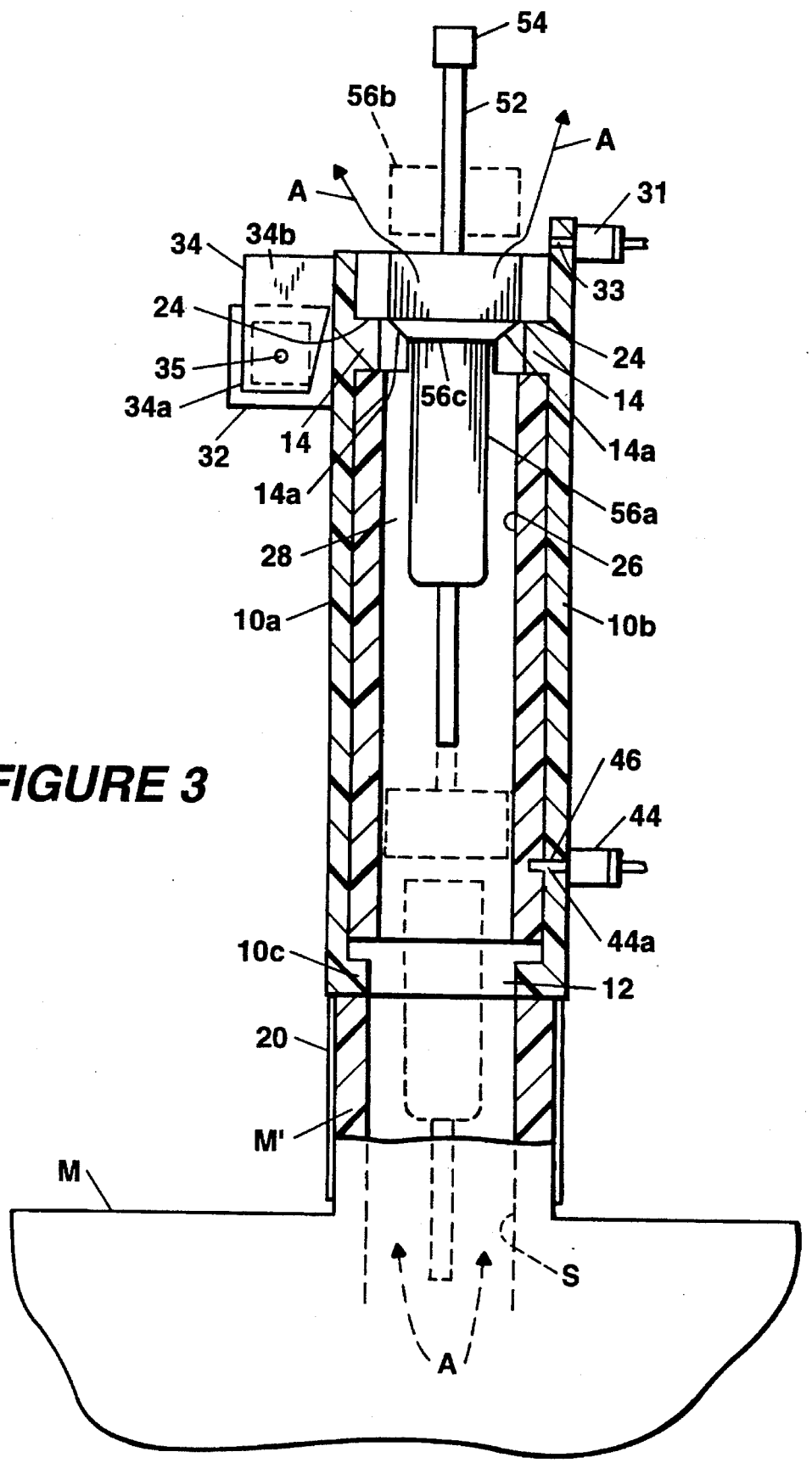
FIG. 3 is a sectional view taken along line 3—3 of FIG. 2.

Housing 10 may have a pair of legs 18 at the opposite ends of bottom wall 10c which are arranged to stand on a spectrometer magnet such as the one indicated at M in FIG. 3. Also, mounted to the underside of housing 10 directly below opening 12 therein is a depending skirt 20 which is arranged to engage snugly around a mesa M' of magnet M which defines the entrance to the vertical air shaft S invariably present in NMR spectrometers of the stated type. During operation of the spectrometer, there is an upwardly flowing air stream A present in shaft S as depicted in FIG. 3.

In some spectrometer instruments, the mesa M' is rectangular requiring that the skirt 20 likewise be rectangular as shown. In other instruments, the mesa is generally cylindrical so that the skirt 20 should have a cylindrical shape. Suitable cut-outs 20a may be provided in the skirt to provide clearance for any tubing or conduits extending from the mesa M'.

Slidably positioned in housing 10 is an elongated carriage 22 which has the same general shape as the space 11 in housing 10 except that it is somewhat less than half as long. The carriage 22 is provided at its opposite sides 22a with a pair of longitudinal slots 24, 24 which are sized to slidably receive the rails 14, 14 projecting into the space 11 so that the carriage 22 can slide along the rails from one end of space 11 to the other.

As best seen in FIGS. 2 and 3, a plurality of generally cylindrical vertical passages 26 are formed in carriage 22. The passages are equally spaced apart along the longitudinal centerline of the carriage and extend entirely through the carriage. Furthermore, the diameters of the passages 26 are such that they intercept the longitudinal slots 24, 24 present in the walls 22a, 22a of the carriage. Thus, when the carriage is slidably mounted to the rails 14, 14, the rails project somewhat into the passages 26, except at the locations of the rail cut-outs 16, 16 described above which are located directly over the opening 12 in the housing bottom wall 10c. In other words, rails 14, 14 do not obstruct a passage 26 that is located over opening 12.

The illustrated sample changer has a carriage with seven passages 26. Obviously, a different size sample changer may have more or fewer such passages. In any event, each passage 26 except the one at the right end of carriage 22 is arranged to releasably receive a sample holder indicated generally at 28. That end passage is a "dummy" passage provided with a cover 29 containing a small vent opening 30 for reasons that will become apparent.

The relative lengths of the carriage 22 and the housing space 11 and the positioning of the passages 26 along the carriage are such that when the carriage is located at the left end of the housing space 11 as shown in FIG. 1, the passage 26 containing the cover 29, denominated the first passage, is located over the housing bottom opening 12. On the other hand, when the carriage 22 is located at the right end of the housing space 11, the passage 26 at the left end of the carriage, i.e. the seventh passage, is located one position to the right of opening 12. Of course, the carriage 22 may be slid along the rails 14, 14 to position any of the sample-containing passages 26 in the carriage, i.e. the second to seventh passages, opposite opening 12.

Carriage 26 may be moved along rails 14, 14 by any suitable means. In the illustrated sample changer, the carriage is stepped along the rails from left to right by means of a pneumatic actuator 32 mounted to a side wall 10a of housing 10. The actuator is basically a double acting piston having a rod 32a projecting from the end of the actuator. Actuator 32 responds to the output of an air sensor 31 mounted to the tip of housing rear wall 10b above opening 12. As will be described in more detail later, sensor 31 senses the air flow passage 26 above opening 12 through a small hole 33 in the housing rear wall.

A generally L-shaped latch member 34 has one leg 34a connected by a pivot 35 to the free end of the actuator rod 32a. The other leg 34b of that member extends through a notch 36 in the adjacent side wall 10a of housing 10 and is adapted to engage in any one of a series of slots 38 equally spaced apart along the adjacent side wall 22a of carriage 22. Preferably, the left hand edges of latch leg 34b and slots 38 are beveled as shown in FIGS. 1 and 2.

Usually, the number of slots 38 in carriage 22 equals the number of passages 26 in the carriage, and the spacing of the slots is the same as the spacing of the passages 26. Thus, in the illustrated sample changer, there are seven such slots 38, the first one being located just to the left of the first passage 26 and the seventh one being located between the seventh passage 26 and the left end of the carriage. To ensure that the latch member leg 34b positively engages in the slots 38, a coil spring 42 is provided to rotatably bias the latch member clockwise as viewed in FIGS. 1 and 2 so that the latch member leg 34b is urged toward the carriage.

The throw of actuator 32 is such that when the latch member 34 is engaged in a slot 38 and the actuator rod 32a is extended, the carrier is moved to the right along rails 14, 14 a distance equal to the centerline spacing of the adjacent passages 26. Thus, for example, assume that the carriage 22 is located at the left end of the housing space 11 such that the first passage 26 is situated over the opening 12 in the housing bottom wall 10c and the latch member is engaged in the first slot 38 as depicted in FIG. 1. If the actuator rod 32a is now extended, carriage 22 will be moved along the rails 14, 14 to position the second passage 26 over opening 12 as shown in FIG. 2. It should be noted that the notch 36 in the housing front wall 10a is sufficiently long to provide clearance for the latch member 34 over the full throw of actuator 32.

Preferably, to prevent carriage 22 from overshooting when stepped as aforesaid, a small piston 44 (FIG. 3) may be mounted to housing rear wall 10b near the bottom thereof. The piston includes a rod or pin 44a that extends through wall 10b and is arranged to engage in any one of a series of holes 46 spaced along the wall 22a of carriage 22. Pin 44a is biased by a spring 45 (FIG. 4) to an extended position. When actuator rod 32a is extended, pin 44a is retracted. After a short time delay, the pin 44a extends and slides along the carriage imparting drag until it snaps into the next hole 46 and positively stops the carriage.

After the carriage 22 has been shifted one passage 26 position as aforesaid, the actuator rod 32a may be retracted. This causes the beveled end of the latch member leg 34b to wedge out of the slot 38, the latch member 34 rotating counter clockwise on its pivot 35 as needed against the bias of spring 42. Resultantly, the latch member disengages from the slot 38 and is free to move with the actuator rod 32a. As the rod 32a retracts, the beveled end of leg 34b slides along the carrier 22 until it snaps into the next slot 38 which was moved to a position near the left end of notch 36 as the carriage 22 was stepped to the right as just described. The engagement of the pin 44a in the hole 46 as described above also prevents carriage 22 from moving leftward when actuator rod 32a retracts.

Preferably, a shoulder 34d is provided on the left face of latch member 34 which engages the left edge of notch 36 to provide a positive stop for the clockwise motion of the latch member to prevent the beveled end of the latch member leg 34b from cutting into the carriage member 22 when the latch member snaps into the slots 38.

Thus, by cycling actuator 32, the carriage 22 may be stepped along the rails 14, 14 to position successive passages 26 over the opening 12 in the housing bottom wall 10c. In the illustrated sample changer having a carrier with seven passages 26, seven such cycles of the actuator 32 will position the carriage 22 at the right end of the housing space 11 such that the passage 26 at the left end of the carriage, i.e. the seventh passage, is located one step to the right of opening 12.

Referring to FIG. 1, the sample holders 28 seated in passages 26 are similar to conventional sample holders used in NMR spectrometers. Each comprises a tube 52 made of a non-ferromagnetic material such as glass or plastic. The lower end 52a of tube 52 is closed, while the tube upper end 52b is open to allow the introduction of a fluid sample into the tube. After a sample is introduced into the tube, that upper end 52b may be closed by a suitable cap 54.

A support 56 is provided to hold tube 52. Support 56 may be a relatively-light-weight, solid or hollow stopper-like member having a generally cylindrical main body 56a and a circular flange 56b at the upper end of body 56a, there also being a beveled or frustoconical surface 56c at the boundary between the main body and the flange. The sample tube 52 is snugly received in an axial passage 58 in the support 56 and may be retained there by friction or by a suitable adhesive. The support 56 is dimensioned so that it can be slidably received in the magnet shaft S (FIG. 3). The holder flange 56b has minimal clearance with the shaft S wall so that the holder 28 can "float" on the air stream A in shaft S and be moved up and down in the shaft by varying the velocity of the air stream A.

As described above, the rails 14, 14 intercept the passages 26 of carriage 22 except at the location of the cut-outs 16 located over the opening 12 in the bottom wall 10c of the housing. When the holders 28 are deposited in the carriage passages 26, each holder support 56 and, more particularly, the beveled surface 56c thereof seats against the similarly beveled edges 14a, 14a of the rails 14, 14. Thus, each holder 28 is supported in its respective passage 26 except when the carriage 22 is shifted to position that holder directly over the opening 12 in the housing bottom wall. When a holder 28 is in that position, due to the rail cutouts 16, 16, it is no longer supported by the rails 14 and is free to be lowered from its passage 26 down into the shaft S aligned with that passage, as shown in phantom in FIG. 3.

In some cases, it may be desirable to the heat or cool the samples in the various sample holding tubes 52 before and/or after analysis. Accordingly, lengthwise passages 60 may be provided in housing bottom wall 10c as shown in FIG. 2 which communicate with a lengthwise series of vertical holes 60a, is that wall. These holes are positioned under the tubes 52 of the sample holders 28 in carriage passages 26 as the carriage is stepped along the rails 14, 14. Passages 60 may be connected to any suitable source of hot or cold gas.

It is important to note that the sample changer, or more particularly the passage 26 of carriage 22 that is located over the opening 12, functions as an extension of the shaft S such that the upwardly flowing air stream A is conducted into that operative passage 26. Resultantly, a holder 28 in that passage may be moved up and down within the passage as shown in phantom in FIG. 3 by the air stream from the spectrometer. Consequently, when that air stream is controlled in the usual way, the sample holder may be lowered from the changer down into the shaft S of the spectrometer to the sample locator therein for analysis of the sample in that holder. Then, when the analysis of the sample is completed and the velocity of the air stream A is increased to return the sample holder 28 to the top of shaft S, the holder will continue upward into the carriage passage 26 from which it came. More specifically, sample holder 28 will be raised to the top of its passage 26 and will float there on the escaping air stream A so that its beveled surface 56c is disposed above the rails 14, 14 as shown in phantom in FIG. 3. Then, when the actuator 32 is cycled again to step the carriage 22 toward the right to its next position, the aforementioned holder 28 will be shifted out of air stream A and beyond the rail cut-outs 16, 16. Thus, while that holder 28 will no longer be supported by the air stream, it will again be supported by the rails 14, 14 as the next passage 26 of carriage 22 and the holder 28 therein are moved opposite the housing opening 12 and the upwardly flowing air stream thereat.

As noted previously, the first passage 26 in carriage 22 is usually not intended to contain a holder 28. When initializing the sample changer for a sample run, the carriage 22 may be moved to the position shown in FIG. 1 wherein the first or "dummy" passage 26 is located over opening 12. This may be done by manually retracting latch member leg 34b away from the carriage and sliding the carriage to the left end of housing space 11. Then, loaded sample holders 28 may be placed in the open passages 26 and the changer positioned over the spectrometer shaft S as shown in FIGS. 1 and 3. The skirt 20 which engages around mesa M' holds the changer securely in place on the spectrometer. At this time, any air stream A in the shaft S may vent through the vent hole 30 in the cover 29 over the first passage 26 until it is time to deposit the first sample of the run in the spectrometer shaft S. That air venting through hole 30 will be sensed by the air flow sensor 31.

Figure 4:
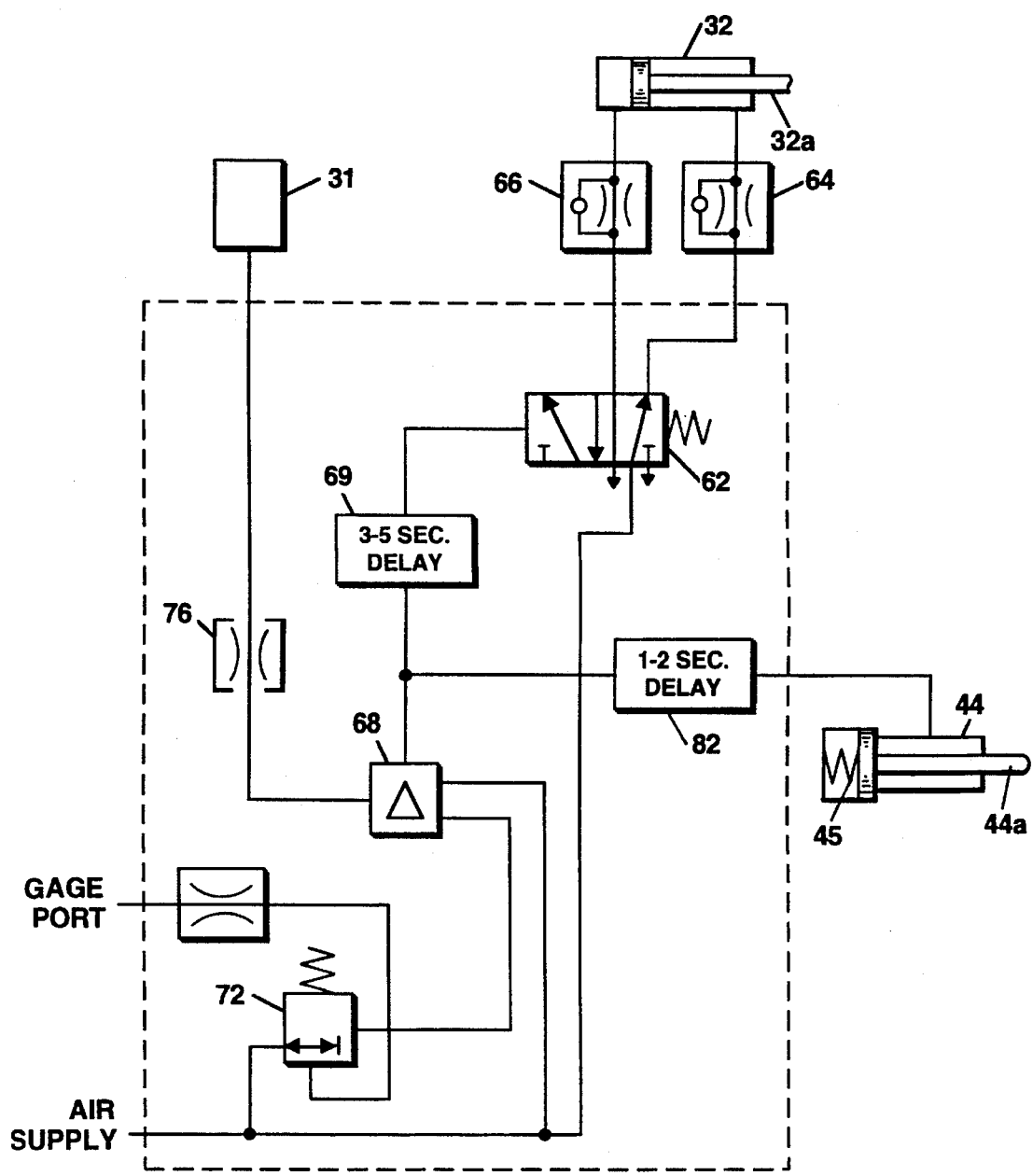
FIG. 4 is a diagramic view of a pneumatic control circuit for the FIG. 1 changer.

Refer now to FIG. 4 which illustrates a simple pneumatic circuit for controlling the actuator 32 so that the changer automatically delivers successive samples supported in the carriage 22 to the shaft S of the spectrometer for analysis and retrieves the samples from the shaft after analysis as required by the spectrometer. Air from a suitable air supply is fed directly to a two position valve 62. When the valve 62 is in a first position, the air is conducted by way of a flow restricter 64 to one end of the actuator 32, while the other end of the actuator is vented by way of a second flow restricter 66, causing the actuator rod 32a to assume its retracted position. In the other position of valve 62, air is supplied by way of restrictor 66 to the other end of the actuator, while the one end is vented through restrictor 64. This causes the actuator rod 32a to assume its extended position. Valve 62 is biased to its first position so that the actuator rod 32a is normally retracted.

Valve 62 is moved to its second position by the output of a fluid amplifier 68 which receives air directly from the air supply. Preferably, the amplifier output is fed to the valve by way of a pneumatic delay 69. In addition, amplifier 68 receives bias air by way of a regulator 72 connected to the air supply.

The control circuit also includes the air flow sensor 33 whose output is applied by way of a flow restrictor 76 to amplifier 68. A gage port may also be provided to facilitate setting regulator 72 so that it supplies low pressure, e.g., 2 lbs., bias air to amplifier 68 enabling the amplifier to respond to the control signal from sensor 33. Regulator is turned on manually to activate the control system. After that, the changer responds to the presence or absence of air stream A in the passage 26 over opening 12 as detected by the air flow sensor 33. When the air stream is present, valve 62 extends actuator rod 32a to step carriage 22 along rails 14, 14 one passage 26 position as described above. When the air stream is not detected, valve 62 retracts rod 32a in preparation for the next advancement of the carriage.

The output of amplifier 68 is also applied by way of a delay 82 to piston 44 for the reasons described above.

To use the sample changer, the carriage 22 is positioned at the left end of housing 10 as shown in FIG. 1. Then, the various sample holders 28 containing the samples to be analyzed are loaded into the passages 26 and the changer is positioned on the spectrometer as shown in FIG. 1. The upwardly flowing air stream A in the shaft S of the spectrometer is turned on and controlled in the usual way. The sample changer effectively adds an extension, namely the first or rightmost passage 26 of carriage 22, to the top of shaft S so that the air is constrained to flow upward into that passage. As noted previously, that first passage in does not contain a sample holder 28 and the air in the air stream A is vented through the hole 30 of the cover 29 on that passage. The sensor 31 senses that vented air stream at hole 33 and applies a signal to amplifier 68, however, nothing will happen until regulator 72 is turned on.

To start a sample run, the regulator 72 is turned on. Since sensor 31 senses air flow and is applying a signal to amplifier 68, the amplifier will apply an output to valve 62 causing the valve to extend actuator rod 32a. As noted above, the signal to the valve is delayed 3–5 seconds. This minimizes oscillation of the valve. That rod, by way of the latch member 34, shifts carriage 22 along rails 14, 14 one step to position the second passage 26 opposite the opening 12 in the bottom of housing 10 as shown in FIG. 2. The operation of the locking pin 44a assures that the carriage 22 will stop at the correct location. The sample holder 28 in that passage is thereupon lifted up and supported by the air stream A issuing from shaft S. Since sensor 31 still detects an air stream at hole 33, valve 62 maintains actuator rod 32a in its extended position. That air stream from the spectrometer may then be controlled in the usual way to lower the sample holder down into shaft S to the sample locator which places the sample in the holder's tube 52 at the proper location in the spectrometer for analysis. As soon as the air flow sensor 31 no longer senses the presence of the air stream at hole 33, the signal to amplifier 68 ceases causing the valve 62 to return to its first position. This retracts actuator rod 32a causing latch member 34 to engage in the second slot 38 of carriage 22.

Following the analysis, the air velocity in shaft S may be increased again by the spectrometer to raise the sample holder to the top of its passage 26 in the sample changer. The air stream escaping around holder 28 at the top of that passage 26 is sensed by sensor 31 through hole 33 causing amplifier 68 to apply another delayed signal to valve 62. Resultantly, the valve assumes its second position thereby extending the actuator rod 32a. This steps the carriage 22 along to position the third passage 26 and sample holder 28 therein over the opening 12 in housing 10 in preparation for the analysis of the sample in that holder, the locking pin 44a positively stopping the carriage. The holder 28 in that passage is now bouyed up by the air stream. A sensor 31 detects that air flow at hole 33 so that actuator rod 32a remains extended.

Again, the air flow in the shaft S is controlled as usual to lower the second sample holder from its passage in the changer down into shaft S. Valve 62 responds to the absence of a signal from sensor 31 by retracting the actuator rod 32a to position the latch member 34 in the second slot 38. As soon as the sample in the holder is analyzed, the holder is raised to the top of the shaft and returned to the same passage 26 in the changer carriage. The escaping air stream at the top of the passage 26, marking the return of the holder to its passage, is sensed by sensor 31 which initiates the next cycle of actuator 32 to step the carriage 22 along rails 14, 14 to position the third passage 26 over opening 12, and so on until the sixth or last sample holder 28 has been returned to the seventh or last passage in the changer carriage. When that last sample holder has been returned, the escaping air stream sensed by sensor 31 at hole 33 will cause the sensor to issue one or more signal to amplifier 68. In response, the amplifier will control the valve to extend actuator rod 32a one more time to step the carriage 22 so that the last passage 26 is positioned beyond opening 12 and the holder 28 in that passage is again supported by rails 14, 14. At this point, if the air stream A in the shaft S is stopped or reduced, actuator rod 32a may retract causing latch member 34 to disengage entirely from the carriage and take up a position to the left of the carriage. The changer will remain in this condition until regulator 72 is turned off and the changer is removed from the spectrometer.

If it becomes necessary to interrupt a sample run for any particular reason, e.g., to substitute a sample, this may be done simply by turning off regulator 72. Actuator 32 will then assume its retracted position until the regulator is turned on again.

While we have illustrated specifically a sample changer having a linear carriage, it should be obvious that the same principles may be applied to a changer whose carriage is a carousel having a circular array of sample holder passages 26. By rotating the carousel using a rotary actuator, the different passages in the array and the sample holders therein may be positioned over shaft S to achieve the same results described above.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention described herein.

I claim:

1. A sample changer for sample analyzing apparatus of the type having a generally vertical sample loading air shaft in which an upflowing air stream is present, said changer comprising:

support means for positioning at the apparatus;

a carriage movably supported by the support means, said carriage having an array of generally vertical passages extending entirely through the carriage, said passages being adapted to contain sample holders;

an air sensor for detecting a change in a flow of air from the air shaft which change occurs when a sample holder has been raised in the air shaft above a predetermined height by the upflowing air stream, the air sensor outputting a detection signal when said change in air flow is detected;

an advancing mechanism for moving the carriage relative to the support means in response to the detection signal to sequentially position each passage over the air shaft so that said each passage becomes an extension of the air shaft whereby the sample holder in said air shaft may be buoyed up and supported in its passage by the air stream from said air shaft; and means for preventing the sample holders from dropping out of said air passages except when a passage is directly over the air shaft.

2. The sample changer defined in claim 1 wherein the advancing mechanism does not move the carriage when a sample holder is in the air shaft.

3. The sample changer defined in claim 1 wherein:

the array of passages is a linear array having a longitudinal axis, and said support means and said carriage include interfitting surfaces which constrain the motion of the carriage to linear motion parallel to said longitudinal axis.

4. The sample changer defined in claim 3 wherein:

said carriage includes a pair of parallel grooves on opposite sides of the carriage, said grooves interrupting said passages;

said support means include a pair of parallel rails which are slidably received in said grooves, and said preventing means include portions of said rails projecting into said passages, said rail portions being relieved at locations directly over said air shaft so that the rail portions do not obstruct the carriage passage located directly over said air shaft.

5. The sample holder defined in claim 4 and further including sample holders situated in at least some of said passages, said sample holders being supported from below by the rail portions projecting into at least some of said passages.

6. The sample changer defined in claim 3 wherein said advancing mechanism comprises:

a linear actuator responsive to the air sensor which is mounted to said support means, said actuator including a shaft having an outer end and being movable between extended and retracted positions along an axis parallel to said longitudinal axis; and a latch member mounted to said air shaft outer end, said latch member being arranged to releasably engage said carriage when said shaft is moved toward its extended position so as to move said carriage parallel to said longitudinal axis.

7. The sample changer defined in claim 6 wherein the travel of the actuator shaft between said extended and retracted positions substantially equals the centerline distance between adjacent passages in said passage array.

8. The sample changer defined in claim 7 wherein:

said carriage includes a linear array of slots formed along said carriage, the distance between adjacent slots in the array being substantially equal to the centerline distance between adjacent passages in the passage array, and said latch member releasably engages in said slots when said actuator rod is moved toward its extended position.

9. The sample changer defined in claim 6 wherein the actuator is movable to position successive passages in the passage array directly over said air shaft.

10. The sample changer defined in claim 9 wherein the actuator is movable so as to position the carriage such that a sample holder is situated in a passage in the passage array that is located directly over said air shaft.

11. The sample changer defined in claim 6 wherein the actuator is a pneumatically controlled actuator.

12. The sample holder defined in claim 1 wherein the signal from the air sensor is a pneumatic signal.

13. A sample holder for a spectrometer of the type having a generally vertical sample loading shaft in which an upflowing air stream is produced, said sample changer comprising:

a housing having a loading station, the housing being positioned relative to the spectrometer so that the loading station is situated directly over said air shaft;

a carriage movably positioned in said housing, said carriage having an array of generally vertical passages, said passages each being capable of supporting a, sample holder;

means for preventing sample holders from dropping out of any passages not aligned with the loading station; and an air sensor for detecting a change in a flow of air from the air shaft which change occurs when a sample holder has been raised in the air shaft above a predetermined height by the upflowing air stream, the air sensor outputting a detection signal when said change in air flow is detected;

an advancement mechanism for moving the carriage relative to the housing in response to the detection signal to sequentially align each of said passages with the loading station so that said each of said passages, in turn, becomes an extension of said air shaft and receives the upflowing air stream from said air shaft, and a sample holder at the loading station is released from the passage so that it may be supported solely by the air stream thereat.

14. A sample changer for sample analyzing apparatus of the type having a generally vertical sample loading air shaft in which an upflowing air stream is present, said changer comprising:

support means for positioning at the apparatus;

a carriage movably supported by the support means, said carriage having an array of generally vertical passages extending through the carriage, said passages being adapted to contain sample holders;

an advancing mechanism for moving the carriage relative to the support means to sequentially position each passage over the air shaft so that each passage, in turn, becomes an extension of the air shaft whereby the sample holder in each air shaft may be buoyed up and supported in its passage by the air stream from said air shaft; and a pneumatic control circuit which controls the movement of the advancing mechanism and which functions through the use of control signals which are exclusively pneumatic.

* * * * *